United States Patent

Ronay

[11] Patent Number: 5,994,241
[45] Date of Patent: Nov. 30, 1999

[54] METHOD OF FORMING CONDUCTIVE LINES ON A SEMICONDUCTOR WAFER

[75] Inventor: Maria Ronay, Briarcliff Manor, N.Y.

[73] Assignee: International Business Machines Corporation, Armonk, N.Y.

[21] Appl. No.: 08/691,704

[22] Filed: Jul. 31, 1996

[51] Int. Cl.$^6$ .................................................. H01L 21/44
[52] U.S. Cl. .......................... 438/759; 438/763; 438/779; 438/785
[58] Field of Search ..................................... 438/693, 633, 438/759, 763, 779, 785

[56] References Cited

U.S. PATENT DOCUMENTS

| | | | |
|---|---|---|---|
| 4,702,792 | 10/1987 | Chow et al. | 156/628 |
| 4,944,836 | 7/1990 | Beyer et al. | 438/693 |
| 5,209,816 | 5/1993 | Yu et al. | 438/693 |
| 5,246,885 | 9/1993 | Braren et al. | 437/225 |
| 5,300,155 | 4/1994 | Sandhu et al. | 438/693 |
| 5,332,467 | 7/1994 | Sune et al. | 156/636 |
| 5,374,592 | 12/1994 | MacNaughton et al. | 438/643 |
| 5,380,546 | 1/1995 | Krishnan et al. | 427/126.1 |
| 5,424,246 | 6/1995 | Matsuo et al. | 437/192 |
| 5,444,022 | 8/1995 | Gardner et al. | 437/195 |
| 5,607,718 | 3/1997 | Sasaki et al. | 427/97 |
| 5,612,254 | 3/1997 | Mu et al. | 437/195 |
| 5,626,715 | 5/1997 | Rostoker | 438/693 |

FOREIGN PATENT DOCUMENTS

| | | | |
|---|---|---|---|
| 0 529 321 A1 | 3/1993 | European Pat. Off. | H01L 21/90 |
| 44 10 787 A 1 | 9/1994 | Germany | H01L 21/304 |

OTHER PUBLICATIONS

"Alternative Materials and Structure of Chemical–Mechanical Polishing Technology for Advanced CMOS Products" IBM Technical Disclosure Bulletin, vol. 37, No. 9, pp. 145–146, Sept. 1994.

Primary Examiner—Maria Nuzzolillo
Assistant Examiner—Laura Weiner
Attorney, Agent, or Firm—Steven Capella

[57] ABSTRACT

A method of forming metal lines in a patterned dielectric layer. First, a thin (50 Å–500 Å) metal layer of a group VB metal, preferably niobium, is formed on a patterned dielectric layer. Next, an aluminum layer or an aluminum alloy layer is formed on the thin niobium layer. The aluminum layer is preferably formed by depositing a first thickness of collimated aluminum at low temperature followed by high temperature deposition of an equal thickness of aluminum. The aluminum layer is Chem-Mech polished (CMP) with an oxidizing acidic colloidal alumina slurry to expose and oxidize the thin niobium liner which acts as a polish stop. Then, the exposed thin niobium liner is removed using CMP. Alternatively, instead of niobium, the liner may be a thin layer of a group VB metal or an alloy thereof.

19 Claims, 3 Drawing Sheets

~ 0.27 Ω/□

METHOD OF FORMING CONDUCTIVE LINES ON A SEMICONDUCTOR WAFER

RELATED APPLICATION

This Application is related to Application Ser. No. 08/572,362, to Ronay, entitled "A Method of Chemically Mechanically Polishing An Electronic Component" assigned to the assignee of the present invention.

FIELD OF THE INVENTION

The present invention relates to integrated circuit chip manufacture and, in particular, forming conductive lines in an insulating layer of a semiconductor wafer during integrated circuit chip manufacture.

BACKGROUND OF THE INVENTION

A semiconductor chip is an array of devices with conducting terminals that are interconnected by wiring patterns of metal strips. In Very Large Scale Integration (VLSI) chips, these metal wiring patterns are multilayered. Each wiring layer is separated from other conducting layers by layers of insulating material. Interconnections between different wiring pattern layers are made through holes (vias) that are etched through the insulating material layers.

As VLSI chip features shrink and the number of wiring layers increases, surface irregularities in each layer translate to subsequent layers, making each subsequent layer's surface even more irregular. These irregularities distort shapes formed on the surface, making level to level alignment difficult. In some cases, this distortion is so severe as to make it nearly impossible to adequately replicate (print) the intended shape or align printing masks to previous levels.

One prior art way surface irregularities were reduced was to fill the vias with conducting material (i.e., form studs in the vias) before printing the wiring pattern on the surface. However, the raised wire shapes on the surface still left irregularities in subsequent surfaces. Therefore, techniques were developed that are used at various levels to create a nearly perfectly flat, or, planar surface, so that shapes are printed with high dimensional and geometric accuracy. These techniques are known, in the art, as planarization.

One such planarization process is Chemical-Mechanical Polishing, also known as Chem-Mech Polishing or CMP. CMP involves applying an abrasive in a dispersion (known as a slurry) to the wafer surface while polishing the surface. The solution may include additives that chemically react with the surface material. CMP is widely used to planarize dielectric layers to provide a smooth surface for printing wiring patterns.

A CMP application, known as the Damascene process, provides a planar surface with a wiring pattern embedded in an insulating layer, such as $SiO_2$. The embedded wiring pattern is formed by first etching grooves into, but not through, the insulating layer. If the Damascene process is used to form vias instead of grooves, holes are opened through the insulating layer. Once the pattern is formed, a conformal metal layer is deposited onto the patterned surface. The conformal metal layer is chem-mech polished to remove all metal above the insulating layer. After polishing, metal remains only in the patterned grooves or in the holes in the insulating layer. Metal is completely removed from areas that have no grooves or holes, i.e., fields.

Currently, Damascene is preferred to Reactive Ion Etching (RIE) for forming aluminum alloy lines and vias for intra-chip wiring. Normally, the metal layer is an aluminum alloy formed on a thin liner. The liner is formed prior to the high temperature reflow step, when a 200–300 Å thick layer is deposited on the patterned dielectric surface. Next, part or all of the alloy layer, usually Al—Cu or Al—Cu—Si, is deposited on the liner at high temperature, about 500° C. If the liner is titanium, it absorbs oxygen at via interfaces, thereby preventing formation of aluminum oxide and insuring low via contact resistance. Titanium has this oxygen-gettering property because it solves about 10 atomic percent oxygen in its solid state. In addition to reduced via contact resistance, titanium promotes aluminum "flow" onto the liner in the Damascene process, because its oxygen-gettering property also prevents aluminum oxidation. Unfortunately, Damascene process includes both a high temperature reflow step and a CMP step. In both of these steps, a titanium liner also has distinct handicaps.

The first handicap is that during the high temperature reflow step, most of the liner and some of the aluminum is consumed as it combines to form $TiAl_3$. During the high temperature step, typically, most of the 200 Å–300 Å titanium liner forms 600 Å–900 Å of $TiAl_3$, with a much thinner titanium-rich film remaining at the dielectric interface. $TiAl_3$ has a much higher resistivity than aluminum, around 70 $\mu\Omega\cdot$cm. Thus, because this $TiAl_3$ also consumes Al, it reduces the thickness of the aluminum, so that line sheet resistance increases.

FIGS. 1A–C represent Damascene reflow and polishing of a semiconductor structure. In FIG. 1A, aluminum alloy was deposited onto patterned $SiO_2$ layer 102. The pattern recesses are typically 0.25 $\mu$m wide and 0.5 $\mu$m deep. The continuous aluminum layer 100 above the dielectric is thinner over the arrays (of lines) than over more sparsely patterned fields (hereinafter "fields"), because alloy from the layer 100 fills trenches 104 in the array, as identified by reference 108. If the width of the trenches 104 (i.e., the metal lines) and the width of the insulator spaces 106 are equal in the arrays 108, then the continuous aluminum film 100 is thinner by half the trench-depth (i.e., the average surface depression) in the arrays 108, than over the adjacent fields, as identified by reference 110.

Next, the surface aluminum alloy layer 100 is removed in a CMP step. As depicted in FIG. 1B, overpolishing during CMP may cause erosion of the narrow $SiO_2$ spaces in the arrays 108. This is because the aluminum layer 100 is much thicker in the fields 110 than in the arrays 108. So, in this case, completely polishing the aluminum alloy away from the fields 110 causes the patterned array area 108 to be overpolished, because polishing continues long after the aluminum layer 100 has been cleared away. Consequently, the array line thickness 112 is much less than field line thickness (not shown), and much less than desired 114. Since pattern depth determines metal line thickness, the erosion from this overpolishing causes thinner array metal lines resulting in higher array wiring (line) resistance.

Continuing the previous example in FIG. 1C, if the starting line depth was 0.5 $\mu$m, then because of overpolishing in the CMP step, the thickness of the metal 116 remaining in the polished array trenches 104 may be as thin as 0.25 $\mu$m deep. Further, of this 0.25 $\mu$m, as much as 0.1 $\mu$m may have been converted to low conductivity $TiAl_3$ 117. So, the remaining high conductivity aluminum alloy 118 is only 0.15 $\mu$m thick.

Consequently, because Al is consumed as $TiAl_3$ during high temperature treatment and further because of overpolishing, it is difficult to lower line sheet resistance in arrays. Low line sheet resistance is a requirement for making acceptable wiring resistance. Further, this consumption of Al makes uniform wiring sheet resistance across a chip, much less across a wafer, an impossible goal.

PURPOSES OF THE INVENTION

It is a purpose of the present invention to form conductive lines in an insulating layer.

It is another purpose of the invention to improve thickness uniformity of conductive lines formed in an insulating layer.

It is yet another purpose of the present invention to improve line thickness uniformity of conductive lines formed in an insulating layer of a semiconductor wafer.

It is yet another object of the invention to reduce the sheet resistance variation of lines formed in a conductive layer of integrated circuit chips.

It is yet another purpose of the present invention to form lines in an insulating layer of an integrated circuit array chip wherein lines formed in array areas have substantially the same thickness as lines formed in non array fields.

SUMMARY OF THE INVENTION

The present invention is a method of forming metal lines in a patterned dielectric layer. The preferred method includes: a) Forming a thin (50 Å–500 Å) niobium layer on a patterned $SiO_2$ layer; Forming an aluminum or aluminum alloy layer on the liner by first a low temperature Al deposition, followed by a high temperature Al deposition; Chem-Mech Polishing the aluminum layer with an oxidizing acidic colloidal alumina slurry to expose the niobium liner; and then, removing the exposed niobium liner. Alternatively, the thin niobium liner may be replaced by a thin layer of a group VB metal or an alloy thereof. Also a two-step Chem-Mech polish may be used to remove the aluminum layer and expose the niobium liner.

DESCRIPTION OF THE PREFERRED EMBODIMENTS

Figure 1A:
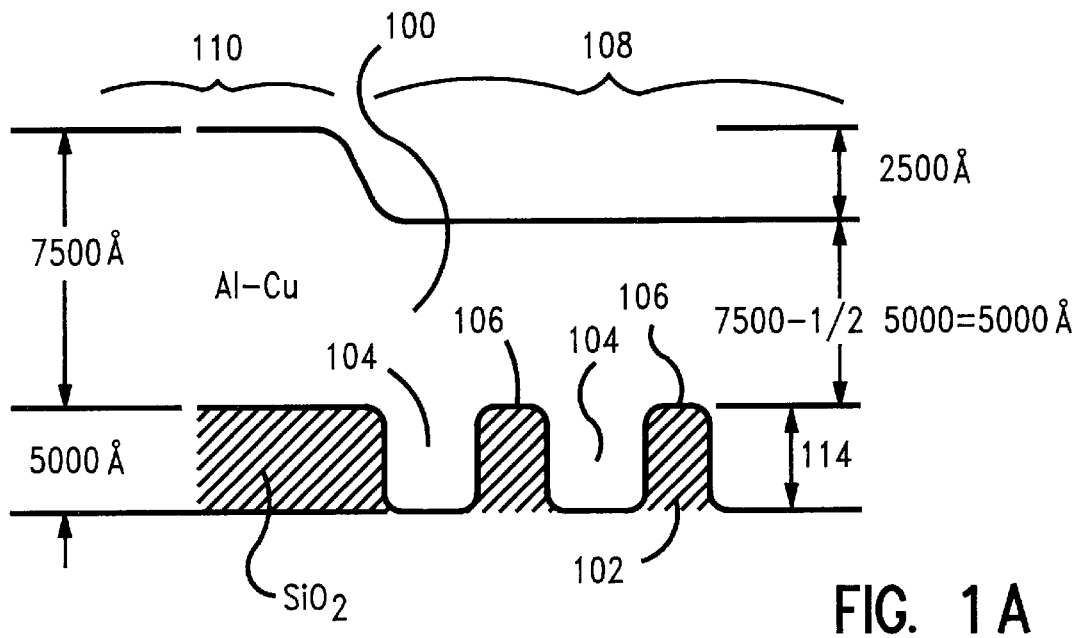
FIGS. 1A–C represent array lines formed according to a prior art Damascene process.
Figure 1B:
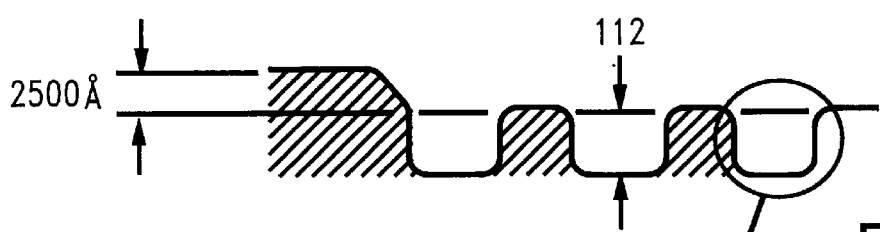
Figure 1C:
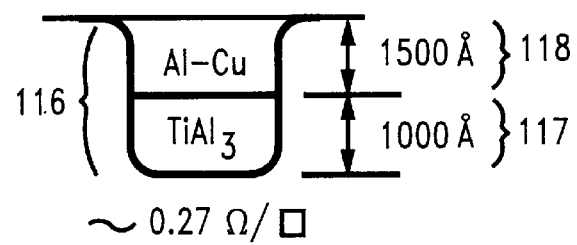
Figure 2A:
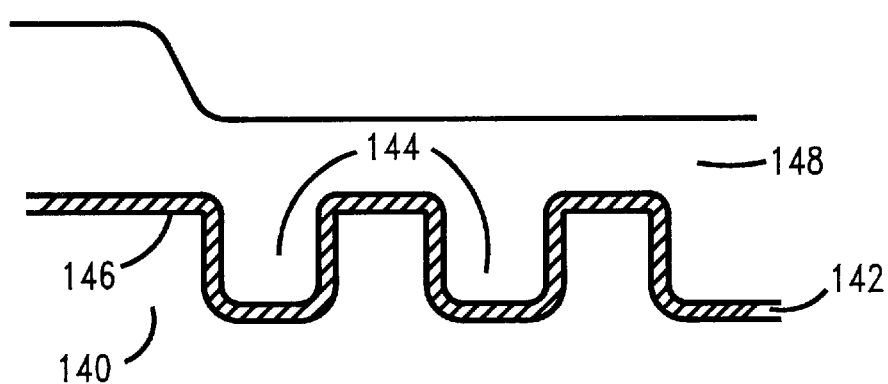
FIGS. 2A–D represent array lines formed according to the preferred embodiment of the present invention.

In the preferred embodiment of the present invention, as represented in FIG. 2A, a dielectric ($SiO_2$) layer 140 is patterned and then, covered with a thin niobium liner 142 prior to deposition and CMP. The pattern 144 may be for vias or be a wiring pattern. The niobium layer 142, preferably, a 50–500 Å thick layer, is formed on the surface 146 of the patterned dielectric layer 140 in a manner similar to that for forming a prior art titanium liner. As with the prior art titanium liner, the niobium liner 142 reacts with oxygen at via interfaces, thereby providing low via contact resistance. Advantageously, however, the niobium liner 142 prevents array erosion and is resistant to combination with aluminum.

In the preferred embodiment of the present invention, an aluminum layer 148 is formed in two steps, depositing half of the thickness in each step onto the niobium liner 142. First, aluminum or aluminum alloy is deposited at low temperature, preferably 25°–150° C., onto the niobium layer 142. This low-temperature deposition may be collimated aluminum or what is known in the art as "long throw" aluminum deposition. Furthermore, after low temperature deposition, the deposited aluminum or aluminum alloy may be reflowed at a temperature, typical for reflowing higher aluminum. Second, hot (400°–500° C.) aluminum (or aluminum alloy) is deposited onto the low temperature aluminum layer to complete formation of aluminum layer 148. Preferably, equal thicknesses of aluminum are deposited in each step. Alternatively, what is known in the art as "force filling" may be used to form the Al lines. Force filling means, essentially, forming Al bridges over the patterned dielectric and using high pressure gas to force the bridged aluminum into spaces below, filling the pattern with aluminum or aluminum alloy. Also, force filling may be combined with low-temperature deposition to form the lines.

Figure 3:
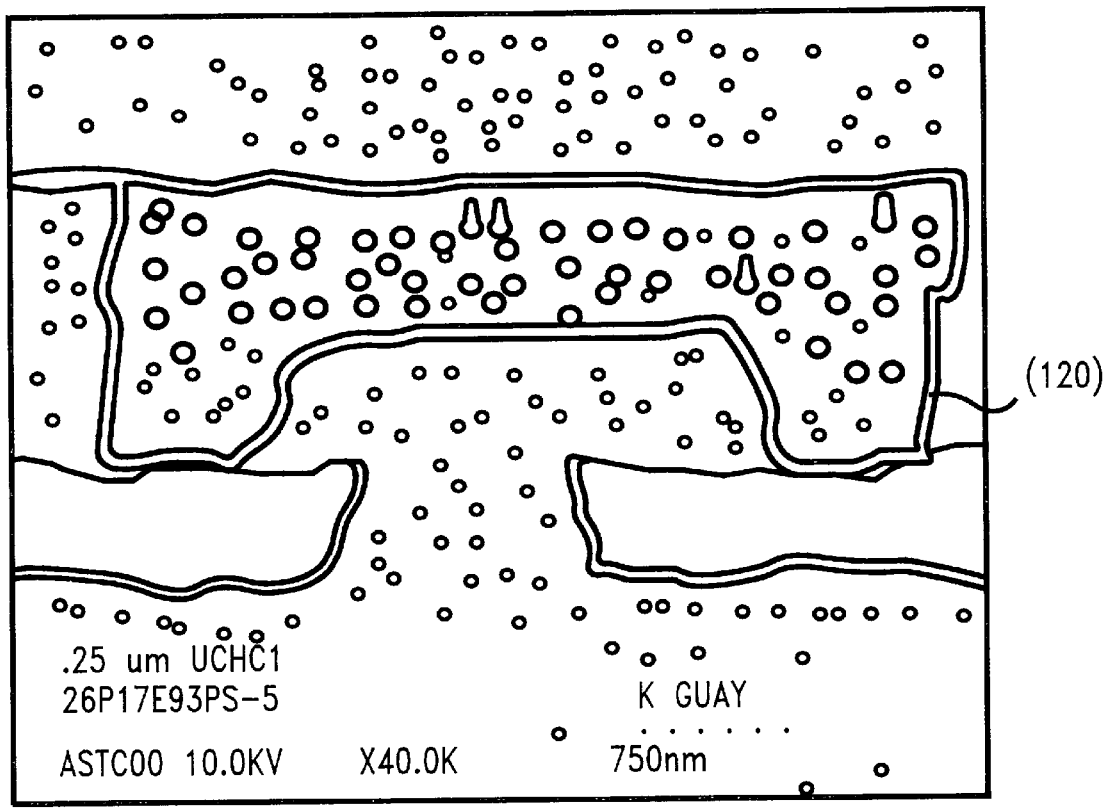
FIG. 3 is a reproduction of a photograph of a cross section of a contact made according to the preferred embodiment of the present invention.

Since $NbAl_3$ forms above these deposition temperatures, very little, if any, $NbAl_3$ forms. For example, FIG. 3 is a duplication of a Scanning Electron Microscope (SEM) photograph at a via cross section. In the via of FIG. 3, 2000 Å of collimated aluminum alloy was deposited at low temperature on a 200 Å niobium liner layer. This was followed by deposition of 5500 Å hot (500° C.) aluminum alloy. The uniformity of the thin niobium liner 142 indicates that no $NbAl_3$ formed. X-ray diffraction verified that the structure was free of $NbAl_3$. The SEM photograph copy shows that the aluminum layer 148 is free of voids. The absence of $NbAl_3$ results in improved (lower) resistance over prior art vias.

Figure 2B:
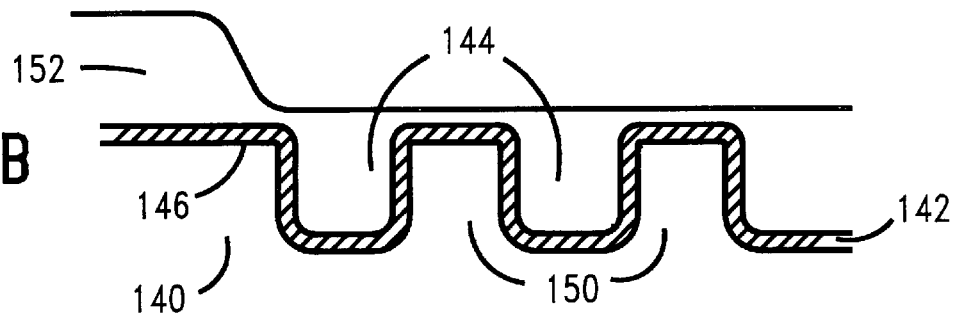
Figure 2C:
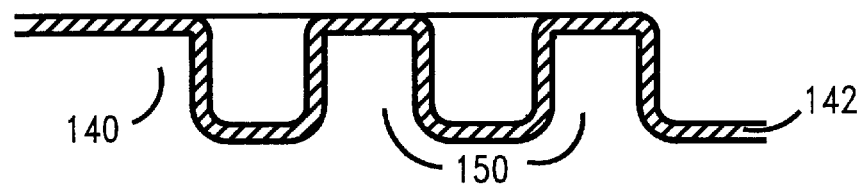
Figure 2D:
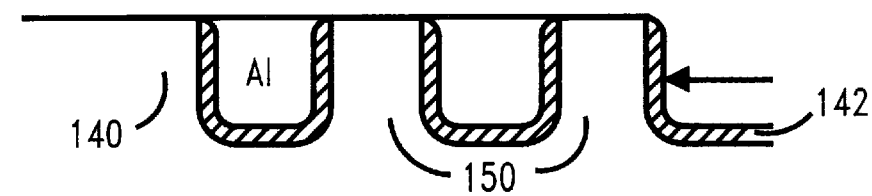

After forming the aluminum layer 148 on the preferred liner 142, in FIGS. 2B–D, excess aluminum alloy is polished from the surface to leave conductive lines in the dielectric 140. In the preferred embodiment of the present invention, the aluminum layer 148 is removed using an oxidizing acidic slurry with 75 nm colloidal alumina particle. In the preferred embodiment, the entire aluminum layer 148 is polished away in a single step. The niobium liner 142, when exposed, to the oxidizing slurry forms $Nb_2O_5$ and acts as a polish stop above the $SiO_2$ 140, reducing erosion of the spaces 150. Thus, the present invention avoids overpolishing problems encountered with prior art liners because the niobium liner 142 provides a polish-stop.

The small (75 nm) alumina particles in the slurry are more numerous for a given weight percentage than larger (e.g. 1 μm) particles would be. So, these smaller alumina particles in the slurry have more surface area than a slurry with the larger particles, which accelerates the aluminum polishing. The prior art titanium liner would not slow or stop polishing in such a slurry and, therefore, would have allowed $SiO_2$ erosion. However, niobium has a very slow polish rate in slurries comprising colloidal alumina particles in an acidic solution with an oxidant additive. The oxidant additive combines with exposed niobium to form an $Nb_2O_5$ surface layer, which is an excellent polish-stop.

Using niobium as a polish stop according to the present invention provides two very beneficial results. First, in arrays, the niobium polish stop prevents, or at the very least, dramatically reduces erosion of the narrow $SiO_2$ spaces 150. So, the array line thickness is maintained near its starting thickness, i.e., the pattern depth as determined by height of the $SiO_2$ spaces 150. Therefore, chips made according to the present invention are much thicker and, so, have a significantly lower array line sheet resistance mean value than prior art chips. Second, the polish rate of the niobium polish stop with an oxidizing acidic colloidal alumina slurry is even slower in the fields than in the arrays. Therefore, if polishing rate on the aluminum film is not uniform across the wafer, polishing can continue even after some fields are cleared. Thus, all residual aluminum may be removed from the wafer without eroding individual arrays or fields. Advantageously, the niobium polish-stop compensates for wafer-wide variations in aluminum film and polish rate and provides a significantly tighter line thickness distribution and, thus, sheet resistance distribution.

There are several alternate embodiments of the present invention. In a first alternate embodiment, the aluminum layer 148 is removed in a two-step polish. In the first of the two polish steps, most of the aluminum layer 148 is removed with a neutral silica slurry. Application Ser. No. 08/572,362, entitled "A Method of Chemically Polishing an Electronic Component" to Ronay, assigned to the assignee of the present invention and incorporated herein by reference, discloses using a neutral silica slurry to remove an aluminum layer from a silicon surface. Although the niobium layer 142 is a polish-stop against acidic alumina slurries with an oxidant additive, it is not a polish-stop against a neutral silica slurry. Consequently, in this alternate embodiment, the first polish ends before the Nb layer 142 is exposed. This extra first step reduces thickness of the overlying aluminum layer 148 as represented in FIG. 2B. After this extra first polish, the thinned aluminum layer 152 is polished away using an oxidizing acidic colloidal alumina slurry, preferably having a 75 nm particle size. Alternatively, a larger alumina particle size may be used. As with the preferred embodiment, during this second polish step, the niobium layer 142 acts as polish stop and prevents erosion of the $SiO_2$ spaces 150 as represented in FIG. 2C.

Finally (in both the preferred and the alternate embodiments) as represented in FIG. 2D, after removing the surface aluminum 148, the exposed niobium polish stop 154 is removed between aluminum lines 156 by Chem-Mech polishing with a colloidal silica slurry. This polish is identical to the extra polish step of the alternate embodiment. Removing the niobium liner 142 exposes the $SiO_2$ surface 146 in the field areas and on the spacers 150. As the present invention minimizes erosion of the dielectric spacers 150, the final line 156 depth is more nearly uniform in both arrays and fields and is closer to the starting line depth. Consequently, array line resistance is lower than prior art array line resistance; across the wafer, line sheet resistance is lower. So, there is a much tighter thickness and resistance distribution than for prior art processes.

By comparison to prior art, Ti and $TiO_{0.01}$ resistance (47.8 and 55.6 $\mu\Omega$·cm, respectively) is much higher than Nb and NbO resistance (13 and 11 $\mu\Omega$·cm, respectively). Although the solubility of oxygen in niobium is only 1 atomic percent, highly metallic NbO forms up to 500° C. Oxygen at the via interface as well as at the niobium aluminum interface is gettered as NbO, thereby providing low contact resistance and assuring good "flow" of aluminum onto niobium.

In additional alternate embodiments of the present invention metals in Group VB of the Periodic Table of Elements (e.g. vanadium or tantalum, or any alloys of niobium, vanadium and tantalum) are substituted for niobium. These alternate embodiments achieve the favorable results of niobium, with only a slight variation of properties.

In still other alternate embodiments, titanium is alloyed with these group VB metals to take advantage of the fact that titanium is an excellent "flow" promoter of aluminum. So, lines made with liners of Nb—Ti, V—Ti, or Ta—Ti alloys containing 10–90% of the alloying Ti are alternate embodiments of the present invention. For these alloys, the group VB element exhibits the polish-stop qualities of the Nb liner, while titanium improves the aluminum flow. In addition, a tantalum liner has a further advantage because of its large atomic weight, which eliminates the need for collimation in the sputtering process. Sputtering was required in the prior art in order to form lines with a titanium liner.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

I claim:

1. A method of forming metal lines in a patterned dielectric layer on a semiconductor wafer, said method comprising the steps of:

a) (i) providing a patterned dielectric layer on a semiconductor wafer, and (ii) forming a thin niobium-containing metal layer on said patterned dielectric layer;

b) depositing an aluminum-containing metal layer on said thin niobium-containing metal layer;

c) polishing said aluminum-containing metal layer to expose said thin niobium-containing metal layer, said aluminum-containing metal layer remaining in recesses of said patterned dielectric layer; and d) removing said exposed thin niobium-containing metal layer.

2. The method of claim 1 wherein the thin niobium-containing metal layer is 50–500 Å thick.

3. The method of claim 1 wherein the thin niobium-containing metal layer is 200 Å thick.

4. The method of claim 1 wherein the aluminum-containing metal layer is an aluminum alloy and the step (b) of depositing the aluminum-containing metal layer comprises:

i) depositing a first thickness of collimated aluminum alloy layer at a first temperature; and ii) depositing a second thickness of aluminum alloy layer at a second temperature higher than said first temperature.

5. The method of claim 4 wherein said second thickness is equal to said first thickness and the first temperature is 25°–150° C. and the second temperature is 400°–500° C.

6. The method of claim 4 wherein the step (c) of polishing the aluminum-containing metal layer comprises polishing said aluminum-containing metal layer with an oxidizing acidic colloidal alumina slurry.

7. The method of claim 4 wherein the step (c) of polishing the aluminum-containing metal layer comprises the steps of:

i) polishing said aluminum-containing metal layer with a neutral silica slurry; and ii) polishing said polished aluminum-containing metal layer with an oxidizing acidic colloidal alumina slurry until said thin niobium-containing metal layer is exposed and aluminum-containing metal layer remains only in patterned recesses.

8. The method of claim 1 wherein the exposed thin niobium-containing metal layer is removed in step (d) using a neutral silica slurry to chem-mech polish away the exposed thin niobium-containing metal layer.

9. The method of claim 1 wherein said thin niobium-containing metal layer is an alloy of niobium.

10. A method of forming metal lines in a patterned dielectric layer on a semiconductor wafer, said method comprising the steps of:

a) (i) providing a patterned dielectric layer on a semiconductor wafer, and (ii) forming a 50–500 Å thick niobium-containing metal layer on said patterned dielectric layer;

b) forming an aluminum alloy layer on said niobium-containing metal layer, said aluminum alloy layer forming comprising the steps:
 i) depositing a first thickness of collimated aluminum alloy layer at a first temperature, and
 ii) depositing a second thickness aluminum alloy layer at a second temperature higher than said first temperature;

c) polishing said aluminum alloy layer with an oxidizing acidic colloidal alumina slurry until said niobium-containing metal layer is exposed and said aluminum alloy layer remains only in recesses of said patterned dielectric layer; and d) removing said exposed niobium-containing metal layer.

11. The method of claim 10 wherein the niobium-containing metal layer is 200 Å thick.

12. The method of claim 11 wherein said second thickness equals said first thickness and the first temperature is 25°–150° C. and the second temperature is 400°–500° C.

13. The method of claim 12 wherein the exposed niobium-containing metal layer is removed in step (d) using a neutral silica slurry to chem-mech polish away the exposed niobium-containing metal layer.

14. The method of claim 10 wherein said colloidal alumina slurry contains colloidal alumina having a particle size of 75 μm.

15. The method of claim 10 wherein niobium-containing metal layer is a thin layer of an alloy of niobium metal.

16. A method of forming metal lines in a patterned dielectric layer on a semiconductor wafer, said method comprising the steps of:

a) (i) providing a patterned dielectric layer on a semiconductor wafer, and (ii) forming a 50–500 Å niobium-containing metal layer on said patterned dielectric layer;

b) forming an aluminum alloy layer on said niobium-containing metal layer, said aluminum alloy layer being formed by the steps comprising;
 i) depositing a first thickness of collimated aluminum alloy layer at 25°–150° C., and
 ii) depositing a second thickness of aluminum alloy layer at 400°–500° C.;

c) polishing said aluminum alloy layer with an oxidizing acidic colloidal alumina slurry until said niobium-containing metal layer is exposed and aluminum alloy layer remains only in recesses of said patterned dielectric layer, and d) chem-mech polishing said exposed niobium-containing metal layer with a neutral silica slurry.

17. The method of claim 16 wherein the niobium-containing metal layer is a 200 Å layer of niobium.

18. The method of claim 17 wherein said colloidal alumina slurry contains colloidal alumina having colloidal alumina has a particle size of 75 μm.

19. The method of claim 17 wherein said niobium-containing metal layer is an alloy of niobium with titanium.

* * * * *